(12) United States Patent
Sun et al.

(10) Patent No.: US 12,310,166 B2
(45) Date of Patent: May 20, 2025

(54) LIGHT-EMITTING DEVICE, MANUFACTURING METHOD THEREOF, AND DISPLAY DEVICE

(71) Applicant: BOE TECHNOLOGY GROUP CO., LTD., Beijing (CN)

(72) Inventors: Haiyan Sun, Beijing (CN); Xiaojin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 808 days.

(21) Appl. No.: 17/615,424

(22) PCT Filed: Feb. 24, 2021

(86) PCT No.: PCT/CN2021/077611
§ 371 (c)(1),
(2) Date: Nov. 30, 2021

(87) PCT Pub. No.: WO2022/178702
PCT Pub. Date: Sep. 1, 2022

(65) Prior Publication Data
US 2023/0171983 A1    Jun. 1, 2023

(51) Int. Cl.
| | | |
|---|---|---|
| H01L 51/50 | (2006.01) |
| H10K 50/115 | (2023.01) |
| H10K 50/15 | (2023.01) |
| H10K 50/16 | (2023.01) |
| H10K 71/13 | (2023.01) |
| H10K 71/60 | (2023.01) |
| H10K 85/10 | (2023.01) |
| H10K 85/60 | (2023.01) |

(Continued)

(52) U.S. Cl.
CPC .......... *H10K 50/15* (2023.02); *H10K 50/115* (2023.02); *H10K 50/16* (2023.02); *H10K 71/135* (2023.02); *H10K 71/60* (2023.02); *H10K 85/1135* (2023.02); *H10K 85/631* (2023.02); *H10K 2101/30* (2023.02); *H10K 2102/103* (2023.02)

(58) Field of Classification Search
None
See application file for complete search history.

(56) References Cited

U.S. PATENT DOCUMENTS

2002/0109136 A1    8/2002   Seo et al.
2006/0194077 A1    8/2006   Noguchi et al.
(Continued)

FOREIGN PATENT DOCUMENTS

CN    101087013 A    12/2007
CN    101510586 A    8/2009
(Continued)

*Primary Examiner* — Gregory D Clark
(74) *Attorney, Agent, or Firm* — Myers Bigel, P.A.

(57) ABSTRACT

The present disclosure provides a light-emitting device, a manufacturing method thereof, and a display device. The light-emitting device includes an anode, a cathode, a light-emitting layer between the anode and the cathode, and a hole transport layer between the anode and the light-emitting layer. The hole transport layer includes a first compound and a second compound, and an absolute value of an energy level of the highest occupied molecular orbital of the second compound is greater than or equal to 5 eV and less than or equal to 6.5 eV.

18 Claims, 8 Drawing Sheets

(51) Int. Cl.
    *H10K 101/30*     (2023.01)
    *H10K 102/10*     (2023.01)

(56) References Cited

U.S. PATENT DOCUMENTS

| | | |
|---|---|---|
| 2007/0285010 A1 | 12/2007 | Lee et al. |
| 2009/0115326 A1* | 5/2009 | Chan ............... H05B 33/28 |
| | | 313/504 |
| 2009/0200918 A1 | 8/2009 | Seo et al. |
| 2013/0277655 A1 | 10/2013 | Seo et al. |
| 2017/0054100 A1 | 2/2017 | De Vries et al. |
| 2017/0084855 A1 | 3/2017 | Kam et al. |
| 2017/0133614 A1* | 5/2017 | Gu .................... H10K 50/00 |
| 2017/0155071 A1 | 6/2017 | Han et al. |
| 2021/0367177 A1 | 11/2021 | Seo et al. |

FOREIGN PATENT DOCUMENTS

| | | | |
|---|---|---|---|
| CN | 104247077 A | 12/2014 | |
| CN | 105244451 A | 1/2016 | |
| CN | 105845839 A | 8/2016 | |
| CN | 106232768 A | 12/2016 | |
| CN | 106549108 A | 3/2017 | |
| CN | 106816536 A | 6/2017 | |
| CN | 110323342 * | 3/2019 | ............ H01L 51/50 |
| CN | 110323342 A | 10/2019 | |
| CN | 110416255 A | 11/2019 | |
| CN | 111490070 A | 8/2020 | |
| JP | 2020096171 A | 6/2020 | |
| WO | 2017030953 A1 | 2/2017 | |

* cited by examiner

LIGHT-EMITTING DEVICE, MANUFACTURING METHOD THEREOF, AND DISPLAY DEVICE

RELATED APPLICATIONS

The present application is a 35 U.S.C. 371 national stage application of PCT International Application No. PCT/CN2021/077611 filed on Feb. 24, 2021, the entire disclosure of which is incorporated herein by reference.

TECHNICAL FIELD

The present disclosure relates to the technical field of light-emitting diodes, and in particular to a light-emitting device, a manufacturing method thereof, and a display device comprising the light-emitting device.

BACKGROUND

A light-emitting diode usually comprises an anode, a cathode, a light-emitting layer, a hole transport layer, and an electron transport layer, and is used in various fields, such as the display field, the automotive field, and the medical detection field. According to the material type of the light-emitting layer, the light-emitting diode is generally divided into an organic light-emitting diode (OLED) and an inorganic light-emitting diode. The inorganic light-emitting diode comprises, for example, quantum dot light-emitting diode (QLED). Quantum dots have advantages of, such as high fluorescence quantum yield, narrow emission spectrum, adjustable emission spectrum, etc., and have broad application prospects in display and other fields. In particular, printing technology can be used to prepare low-cost, large-area self-luminous quantum dot light-emitting diode display screen. Therefore, the quantum dot light-emitting diode display screen is expected to develop into one of the mainstream technologies for a new generation of lighting and display applications.

SUMMARY

According to an aspect of the present disclosure, there is provided a light-emitting device, comprising: an anode, a cathode, a light-emitting layer between the anode and the cathode, and a hole transport layer between the anode and the light-emitting layer. The hole transport layer comprises a first compound and a second compound, and an absolute value of an energy level of the highest occupied molecular orbital of the second compound is greater than or equal to 5 eV and less than or equal to 6.5 eV.

In some embodiments, an absolute value of a difference between an energy level of the highest occupied molecular orbital of the first compound and the energy level of the highest occupied molecular orbital of the second compound is greater than or equal to 0.2 eV.

In some embodiments, a hole mobility of the second compound is greater than or equal to $10^{-4}$ cm$^2$/Vs.

In some embodiments, a molar ratio of the first compound to the second compound is 1:1~100:1.

In some embodiments, a general formula (I) of the second compound is:

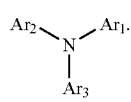

(I)

In some embodiments, a relative molecular mass of the second compound is less than than 4000.

In some embodiments, in the general formula (I), at least one of the groups Ar$_1$~Ar$_3$ is selected from a general formula (II) or a general formula (III). The general formula (II) is:

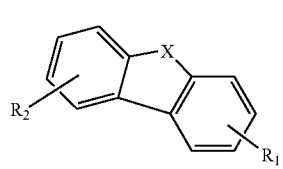

(II)

X is selected from any one of O, N, S, and C; one carbon atom in the general formula (II) or the X atom is connected to the N atom in the general formula (I), and the one carbon atom in the general formula (II) refers to one of the six carbon atoms of two benzene rings in the general formula (II), and the six carbon atoms refer to three carbon atoms of the benzene ring on the right side of the five-membered ring in the general formula (II) except those connected to the branched chain R$_1$ and the five-membered ring plus three carbon atoms of the benzene ring on the left side of the five-membered ring in the general formula (II) except those connected to the branched chain R$_2$ and the five-membered ring. The general formula (III) is:

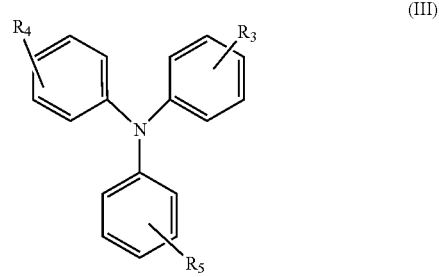

(III)

one carbon atom in the general formula (III) is connected to the N atom in the general formula (I), and the one carbon atom in the general formula (III) refers to any one of the remaining twelve carbon atoms of three benzene rings in the general formula (III) except those respectively connected to the branched chains R$_3$, R$_4$, R$_5$ and the N atom.

In some embodiments, the X atom in the general formula (II) is connected to the N atom in the general formula (I) through a bridging structure, the bridging structure comprising at least one benzene ring.

In some embodiments, the one carbon atom in the general formula (II) is connected to the N atom in the general formula (I) directly or through a bridging structure, the bridging structure comprising at least one benzene ring, and/or the one carbon atom in the general formula (III) is connected to the N atom in the general formula (I) directly or through a bridging structure, the bridging structure comprising at least one benzene ring.

In some embodiments, in the general formula (I), the remaining groups in the groups Ar$_1$~Ar$_3$ except those selected from the general formula (II) or the general formula (III) are selected from a general formula (IV) or a general formula (V). The general formula (IV) is:

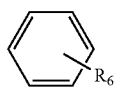 (IV)

any one of the remaining five carbon atoms of the benzene ring in the general formula (IV) except one connected to the branched chain R$_6$ is connected to the N atom in the general formula (I). The general formula (V) is:

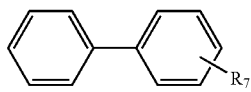 (V)

one carbon atom in the general formula (V) is connected to the N atom in the general formula (I), and the one carbon atom in the general formula (V) refers to any one of the remaining nine carbon atoms of the two benzene rings in the general formula (V) except those connected to the branched chain R$_7$ and connecting the two benzene rings to each other.

In some embodiments, the general formula (IV) is connected to the N atom in the general formula (I) directly or through a bridging structure, the bridging structure comprising at least one benzene ring, and/or the general formula (V) is connected to the N atom in the general formula (I) directly or through a bridging structure, the bridging structure comprising at least one benzene ring.

In some embodiments, each of the branched chains R$_1$~R$_7$ is selected from any one of: substituted or unsubstituted alkyl/alkoxy group having 1~30 carbon atoms, substituted or unsubstituted aryl/aryloxy group having 6~40 carbon atoms, substituted or unsubstituted aralkyl group having 7~40 carbon atoms.

In some embodiments, a material of the first compound comprises a polymer material, and the polymer material comprises any one of polyvinyl carbazole, poly[9,9-dioctylfluorene-co-N-[4-(3-methylpropyl)]-diphenylamine], and poly[N, N'-bis(4-butylphenyl)-N,N'-bis(phenyl)benzidine].

In some embodiments, an average surface roughness of the hole transport layer is less than 5 nm.

In some embodiments, the average surface roughness of the hole transport layer is less than 1 nm.

In some embodiments, the light-emitting device further comprises an electron transport layer. A material of the electron transport layer comprises metal oxide.

In some embodiments, the metal oxide comprises at least two metals.

In some embodiments, the at least two metals comprise Zn and at least one selected from Mg, Al, Ti, Zr, and Li, and a value of the molar ratio of the Zn to the metal oxide is greater than or equal to 0.7.

In some embodiments, the metal oxide is ZnO doped with Mg, and a value of the molar ratio of the Mg to the metal oxide is 0.15.

In some embodiments, an electron mobility of the electron transport layer is greater than or equal to $10^{-4}$ cm$^2$/Vs.

In some embodiments, $10^{-2} \leq$ a hole mobility of at least one of the first compound and the second compound: the electron mobility of the electron transport layer $\leq 10^2$.

In some embodiments, the light-emitting device further comprises a hole injection layer. An absolute value of a difference between an energy level of the highest occupied molecular orbital of the first compound and an energy level of the highest occupied molecular orbital of the hole injection layer is less than or equal to 0.3 eV, and/or an absolute value of a difference between the energy level of the highest occupied molecular orbital of the second compound and an energy level of the highest occupied molecular orbital of the hole injection layer is less than or equal to 0.3 eV.

In some embodiments, a material of the first compound is polyvinyl carbazole, and a molar ratio of the first compound to the second compound is 2:1.

In some embodiments, a material of the hole injection layer is poly(3,4-ethylenedioxythiophene), a material of the electron transport layer is ZnMgO, a material of the light-emitting layer is CdSe quantum dot, a material of the anode is indium tin oxide, and a material of the cathode is aluminum.

In some embodiments, the light-emitting layer comprises quantum dots.

In some embodiments, the light-emitting device is a top emission type or a bottom emission type.

According to another aspect of the present disclosure, a display device comprising the light-emitting device described in any of the foregoing embodiments is provided.

According to still another aspect of the present disclosure, a method of manufacturing a light-emitting device is provided, the method comprises: forming an anode; applying a mixed solution in which at least a first compound and a second compound are mixed on the anode to form a hole transport layer; forming a light-emitting layer on a side of the hole transport layer away from the anode; and forming a cathode on a side of the light-emitting layer away from the hole transport layer. An absolute value of an energy level of the highest occupied molecular orbital of the second compound is greater than or equal to 5 eV and less than or equal to 6.5 eV.

In some embodiments, the step of applying a mixed solution in which at least a first compound and a second compound are mixed on the anode to form a hole transport layer comprises: mixing the first compound and the second compound at a molar ratio of 1:1~100:1 to obtain the mixed solution; and applying the mixed solution on the anode to form the hole transport layer by means of coating, printing or electrohydrodynamic jet printing.

In some embodiments, the step of mixing the first compound and the second compound at a molar ratio of 1:1~100:1 to obtain the mixed solution comprises: mixing the first compound formed of polyvinyl carbazole and the second compound at a molar ratio of 2:1 to obtain the mixed solution.

BRIEF DESCRIPTION OF THE DRAWINGS

In order to more clearly describe the technical solutions in the embodiments of the present disclosure, the drawings that need to be used in the embodiments are briefly introduced below. Obviously, the drawings described below are only some embodiments of the present disclosure. For those of ordinary skill in the art, other drawings can be obtained based on these drawings without creative work.

DETAILED DESCRIPTION OF THE DISCLOSURE

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

As mentioned above, light-emitting diodes have broad application prospects in fields such as displays. However, in conventional light-emitting devices, the injection/transport efficiency of holes is generally lower than that of electrons, resulting in an imbalance of electrons and holes in the device. On the one hand, this will lead to the accumulation of carriers, thereby affecting the lifetime of the device; on the other hand, it will also lead to the loss of luminous efficiency, which in turn affects the luminous performance of the device. This has seriously affected the widespread application of light-emitting devices. Therefore, improving the lifetime and efficiency of light-emitting devices has become an urgent problem to be solved.

Figure 1:
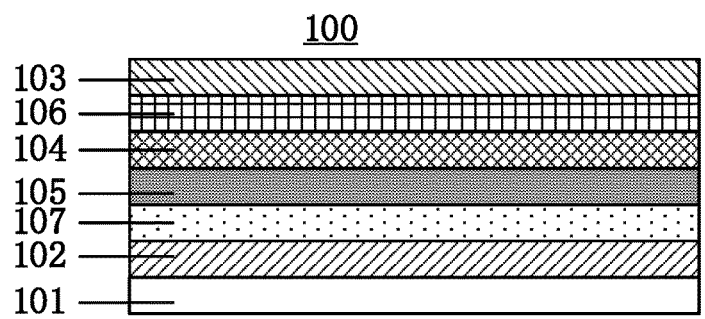
FIG. 1 illustrates the structure of a light-emitting device according to an embodiment of the present disclosure.

In view of this, according to an aspect of the present disclosure, a light-emitting device is provided. Referring to FIG. 1, the light-emitting device 100 comprises an anode 102, a cathode 103, a light-emitting layer 104 between the anode 102 and the cathode 103, and a hole transport layer (HTL) 105 between the anode 102 and the light-emitting layer 104. The hole transport layer 105 comprises a first compound and a second compound, and an absolute value of an energy level of the highest occupied molecular orbital (HOMO) of the second compound is greater than or equal to 5 eV and less than or equal to 6.5 eV.

In some embodiments, the absolute value of the HOMO energy level of the second compound is greater than or equal to 5 eV and less than or equal to 5.5 eV, for example, 5 eV, 5.1 eV, 5.2 eV, 5.3 eV, 5.4 eV, 5.5 eV. In some embodiments, the absolute value of the HOMO energy level of the second compound is greater than or equal to 5 eV and less than or equal to 6 eV, for example, 5 eV, 5.1 eV, 5.2 eV, 5.3 eV, 5.4 eV, 5.5 eV, 5.6 eV, 5.7 eV, 5.8 eV, 5.9 eV, 6 eV. In some embodiments, the absolute value of the HOMO energy level of the second compound is greater than or equal to 5 eV and less than or equal to 6.5 eV, for example, 5 eV, 5.1 eV, 5.2 eV, 5.3 eV, 5.4 eV, 5.5 eV, 5.6 eV, 5.7 eV, 5.8 eV, 5.9 eV, 6 eV, 6.1 eV, 6.2 eV, 6.3 eV, 6.4 eV, 6.5 eV.

It should be noted that although the light-emitting device 100 illustrated in FIG. 1 is a structure in which the anode 102 is below the cathode 103. However, this is only an example, and the light-emitting device 100 may also be an inverted structure in which the cathode 103 is below the anode 102. In addition, the open language "A comprises B and C" means that A comprises at least B and C, but may also comprise any other appropriate structure. For example, the phrase "the hole transport layer 105 comprises a first compound and a second compound" means that the hole transport layer 105 comprises at least the first compound and the second compound, but can also comprise any other suitable materials as required. The embodiments of the present disclosure do not specifically limit this.

Figure 2:
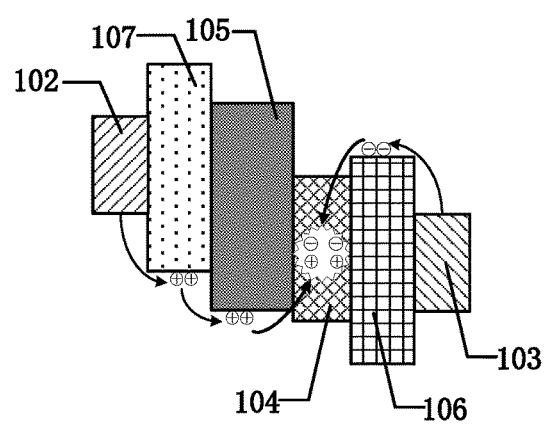
FIG. 2 illustrates a schematic diagram of the energy level structure of the light-emitting device in FIG. 1.

FIG. 2 illustrates a schematic diagram of the energy level structure of the light-emitting device 100. Under a forward bias, holes are injected from the anode 102, and electrons are injected from the cathode 103. The holes are transferred to the light-emitting layer 104 via the hole injection layer 107 (described below) and the hole transport layer 105. The electrons are transferred to the light-emitting layer 104 via the electron transport layer 106. At the light-emitting layer 104, the injected holes and electrons recombine and generate photons through radiation transition, thereby realizing light-emitting. By making the hole transport layer 105 comprise the first compound and the second compound, and by making the HOMO energy level of the first compound coordinate with the HOMO energy level of the second compound (for example, the first compound and the second compound have different HOMO energy levels), the hole transport layer 105 can exhibit a more excellent "energy level transition" effect than the hole transport layer in the conventional art. As a result, on the one hand, the hole transport layer 105 can promote the injection of holes from the hole injection layer 107 to the hole transport layer 105, thereby increasing hole injection, improving hole injection ability, and improving electron-hole recombination, so that the voltage of the light-emitting device 100 can be reduced and the current efficiency can be increased. On the other hand, the hole transport layer 105 can promote the injection of holes from the hole transport layer 105 into the light-emitting layer 104, thereby reducing the accumulation of holes at the interface between the hole transport layer 105 and the light-emitting layer 104, thereby effectively slowing down the degradation process of the hole transport layer

105, increasing the lifetime of the light-emitting device 100, and improving the stability of the light-emitting device 100.

The material of the first compound comprises a polymer material, which comprises but is not limited to any of polyvinyl carbazole (PVK), poly[9,9-dioctylfluorene-co-N-[4-(3-methylpropyl)]-diphenylamine](TFB), and poly[N,N'-bis(4-butylphenyl)-N,N'-bis(phenyl)benzidine](Poly-TPD). In some embodiments, the hole mobility of the first compound is in the range of $10^{-6}$ cm$^2$/Vs~$10^{-2}$ cm$^2$/Vs.

Figure 3:
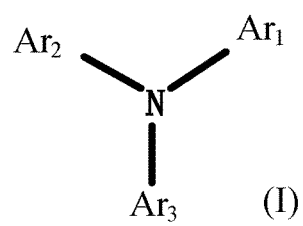
FIG. 3 illustrates the structural formula of general formula (I) according to an embodiment of the present disclosure.

FIG. 3 illustrates the general formula (I) of the second compound. In the general formula (I), the groups $Ar_1$~$Ar_3$ are all connected to the N atom. The groups $Ar_1$~$Ar_3$ represent any appropriate groups that meet the performance parameters (such as HOMO energy level, hole mobility, solubility, etc.) of the second compound, and the structural formulas of the groups $Ar_1$~$Ar_3$ will be described in detail below. The relative molecular mass of the second compound is less than 4000. During the preparation of the light-emitting device 100, the relative molecular mass of less than 4000 makes the second compound have better solubility in the solvent and be not easy to precipitate from the solution. Moreover, the resulting hole transport layer 105 containing the second compound has a smaller surface roughness (for example, less than 1 nm).

Figure 4A:
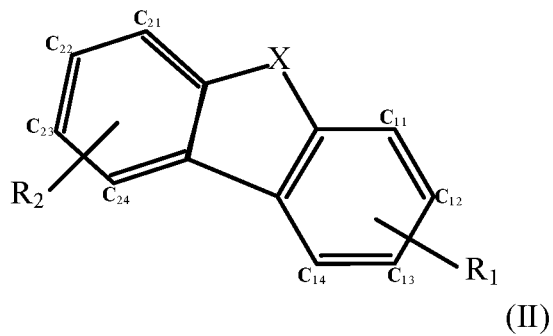
FIG. 4A illustrates the structural formula of general formula (II) according to an embodiment of the present disclosure.
Figure 4B:
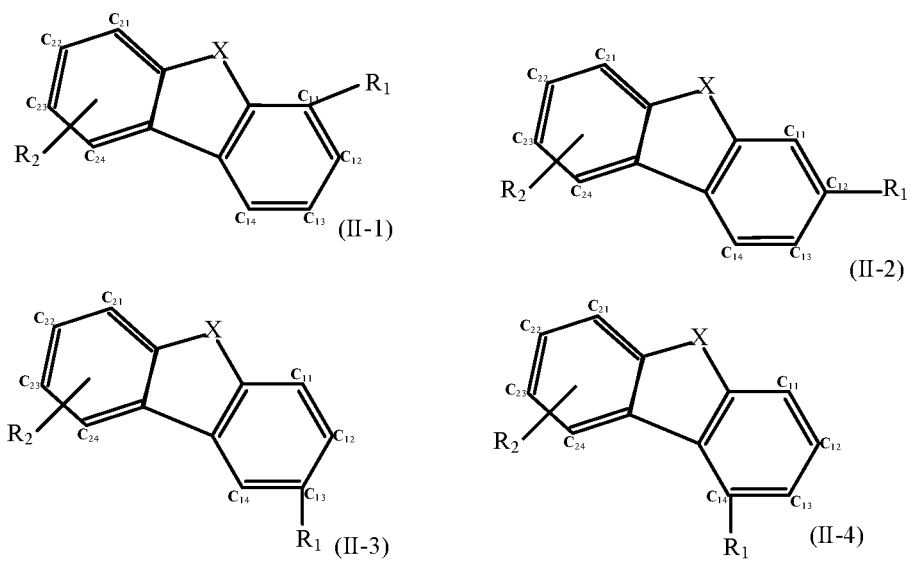
FIG. 4B illustrates a variation of the structural formula of general formula (II) according to an embodiment of the present disclosure.
Figure 4C:
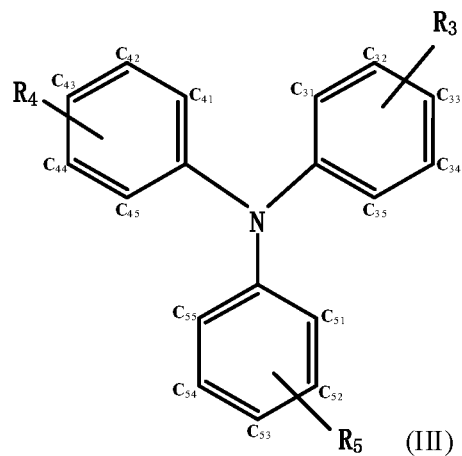
FIG. 4C illustrates the structural formula of general formula (III) according to an embodiment of the present disclosure.

In the general formula (I), at least one of the groups $Ar_1$~$Ar_3$ is selected from the general formula (II) illustrated in FIG. 4A or the general formula (III) illustrated in FIG. 4C.

As illustrated in FIG. 4A, the general formula (II) comprises two benzene rings and a five-membered ring which is located between the two benzene rings and connected to the two benzene rings. The X atom in the five-membered ring is selected from any one of O, N, S, and C. The branched chain $R_1$ is connected to the benzene ring on the right side of the five-membered ring, and the branched chain $R_2$ is connected to the benzene ring on the left side of the five-membered ring. Although those skilled in the art can clearly know the connection position relationship between the branched chain $R_1$ and the branched chain $R_2$ and the corresponding benzene ring when seeing the general formula (II), in order to make the present disclosure clearer, the applicant makes the following explanation: the branched chain Rx (x=1, 2, 3, 4, 5, 6, 7) connecting to the internal blank of the corresponding benzene ring (that is, the branched chain Rx does not connect to a specific carbon atom of the corresponding benzene ring) means that the branched chain Rx can be connected to any appropriate carbon atom of the corresponding benzene ring. The appropriate carbon atom here refers to a carbon atom in the benzene ring that can provide a chemical bond to connect to the branched chain Rx. Taking the branched chain $R_1$ as an example, the branched chain $R_1$ can be connected to any one of the $C_{11}$ atom, $C_{12}$ atom, $C_{13}$ atom, and $C_{14}$ atom of the benzene ring (the other two carbon atoms of the benzene ring have saturated chemical bond due to being connected to the five-membered ring, so they cannot provide a connection to the branched chain $R_1$) on the right side of the five-membered ring. FIG. 4B illustrates several examples where the branched chain $R_1$ is connected to different positions of the benzene ring. In the general formula (II-1), the branched chain $R_1$ is connected to the $C_{11}$ atom of the corresponding benzene ring. In the general formula (II-2), the branched chain $R_1$ is connected to the $C_{12}$ atom of the corresponding benzene ring. In the general formula (II-3), the branched chain $R_1$ is connected to the $C_{13}$ atom of the corresponding benzene ring. In the general formula (II-4), the branched chain $R_1$ is connected to the $C_{14}$ atom of the corresponding benzene ring. Similarly, the branched chain $R_2$ can be connected to any one of the $C_{21}$ atom, $C_{22}$ atom, $C_{23}$ atom, and $C_{24}$ atom of the benzene ring on the left side of the five-membered ring.

Continuing to refer to FIG. 4A, one carbon atom or X atom in the general formula (II) is connected to the N atom in the above general formula (I). The one carbon atom in the general formula (II) refers to one of the six carbon atoms of two benzene rings in the general formula (II), and the six carbon atoms refer to three carbon atoms of the benzene ring on the right side of the five-membered ring in the general formula (II) except those connected to the branched chain $R_1$ and the five-membered ring, plus three carbon atoms of the benzene ring on the left side of the five-membered ring in the general formula (II) except those connected to the branched chain $R_2$ and the five-membered ring. In one embodiment, the branched chain $R_1$ is connected to the $C_{11}$ atom, and the branched chain $R_2$ is connected to the $C_{21}$ atom, then any one of the six carbon atoms of $C_{12}$ atom, $C_{13}$ atom, $C_{14}$ atom, $C_{22}$ atom, $C_{23}$ atom, and $C_{24}$ atom or the X atom of the five-membered ring is connected to the N atom in the above general formula (I).

FIG. 4C illustrates a general formula (III). Similar to the general formula (II), the branched chains $R_3$, $R_4$ and $R_5$ in the general formula (III) are connected to the corresponding benzene ring. Specifically, the branched chain $R_3$ can be connected to any one of the $C_{31}$ atom, $C_{32}$ atom, $C_{33}$ atom, $C_{34}$ atom, and $C_{35}$ atom of the benzene ring at the upper right of the N atom in the general formula (III); the branched chain $R_4$ can be connected to any one of the $C_{41}$ atom, $C_{42}$ atom, $C_{43}$ atom, $C_{44}$ atom and $C_{45}$ atom of the benzene ring on the upper left of the N atom in the general formula (III); the branched chain $R_5$ can be connected to any one of the $C_{51}$ atom, $C_{52}$ atom, $C_{53}$ atom, $C_{54}$ atom, and $C_{55}$ atom of the benzene ring below the N atom in the general formula (III). One carbon atom in the general formula (III) is connected to the N atom in the general formula (I). The one carbon atom in the general formula (III) refers to any one of the remaining twelve carbon atoms of the three benzene rings in the general formula (III) except those connected to the branched chains $R_3$, $R_4$ and $R_5$ and connected to the N atom. In one embodiment, the branched chain $R_3$ is connected to $C_{31}$ atom, the branched chain $R_4$ is connected to $C_{41}$ atom, the branched chain $R_5$ is connected to $C_{51}$ atom, then any one of the twelve carbon atoms of $C_{32}$ atom, $C_{33}$ atom, $C_{34}$ atom, $C_{35}$ atom, $C_{42}$ atom, $C_{43}$ atom, $C_{44}$ atom, $C_{45}$ atom, $C_{52}$ atom, $C_{53}$ atom, $C_{54}$ atom and $C_{55}$ atom is connected to the N atom in the general formula (I).

Figure 4D:
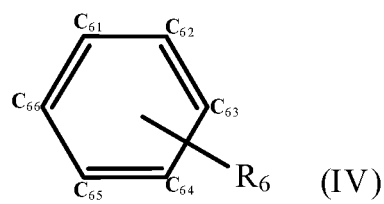
FIG. 4D illustrates the structural formula of general formula (IV) according to an embodiment of the present disclosure.
Figure 4E:
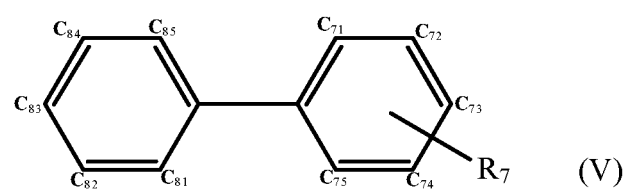
FIG. 4E illustrates the structural formula of general formula (V) according to an embodiment of the present disclosure.

In the general formula (I), the remaining groups in the groups $Ar_1$~$Ar_3$ except those selected from the general formula (II) or the general formula (III) are selected from a general formula (IV) illustrated in FIG. 4D or a general formula (V) illustrated in FIG. 4E. For example, if one of the groups $Ar_1$~$Ar_3$ is selected from the general formula (II) or the general formula (III), the remaining two groups are selected from the general formula (IV) illustrated in FIG. 4D and/or the general formula (V) illustrated in 4E; if two groups in the groups $Ar_1$~$Ar_3$ are selected from the general formula (II) and/or the general formula (III), the remaining one group is selected from the general formula (IV) illustrated in FIG. 4D or the general formula (V) illustrated in 4E; if three groups in the groups $Ar_1$~$Ar_3$ are selected from the general formula (II) and/or the general formula (III), no group is selected from the general formula (IV) illustrated in FIG. 4D or the general formula (V) illustrated in 4E.

Referring to FIG. 4D, the branched chain $R_6$ may be connected to any one of the $C_{61}$ atom, $C_{62}$ atom, $C_{63}$ atom, $C_{64}$ atom, $C_{65}$ atom, and $C_{66}$ atom of the benzene ring. Any one of the remaining five carbon atoms of the benzene ring except one connected to the branched chain $R_6$ can be connected to the N atom in the general formula (I).

Referring to FIG. 4E, the branched chain $R_7$ may be connected to any one of the $C_{71}$ atom, $C_{72}$ atom, $C_{73}$ atom, $C_{74}$ atom, and $C_{75}$ atom of the benzene ring. Any one of the $C_{81}\sim C_{85}$ atoms or any one of the four carbon atoms in the $C_{71}\sim C_{75}$ atoms except one connected to the branched chain $R_7$ in the general formula (V) may be connected to the N atom in the general formula (I).

Figure 5A:
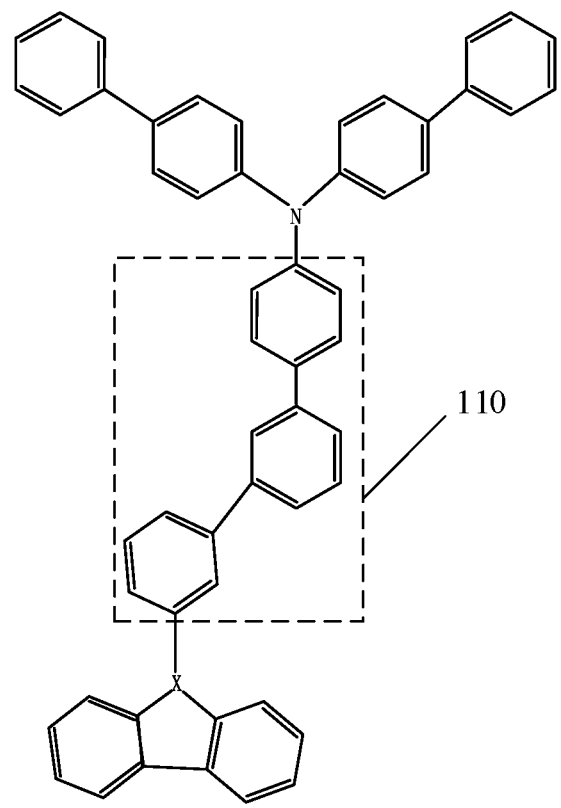
FIG. 5A illustrates a (partial) structural formula of a second compound according to an embodiment of the present disclosure.

In some embodiments, when at least one of the groups $Ar_1\sim Ar_3$ is selected from the general formula (II) and the X atom in the general formula (II) is connected to the N atom in the general formula (I), especially when the X atom is a N atom, the X atom in the general formula (II) is connected to the N atom in the general formula (I) through a bridging structure, and the bridging structure comprises at least one benzene ring. For example, FIG. 5A illustrates a structural formula of the second compound. The structural formula can be the complete structural formula of the second compound or a part of the complete structural formula of the second compound. In this structural formula, the X atom of the general formula (II) is connected to the N atom through the bridging structure 110 illustrated by the dashed line, and the other two chemical bonds of the N atom are directly connected to the general formula (V) respectively. In FIG. 5A, the bridging structure 110 comprises three benzene rings. However, the bridging structure 110 is not limited to this, and may also comprise any appropriate chemical structure such as one benzene ring, two benzene rings, more than four benzene rings, a combination of benzene rings and other chemical structures.

Figure 5B:
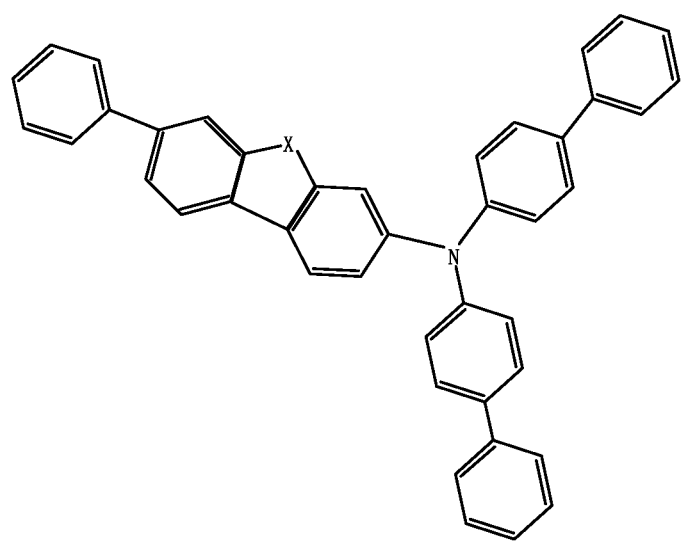
FIG. 5B illustrates another (partial) structural formula of the second compound according to an embodiment of the present disclosure.

In some embodiments, when at least one of the groups $Ar_1\sim Ar_3$ is selected from the general formula (II) and the carbon atom in the general formula (II) is connected to the N atom in the general formula (I), the carbon atom in the general formula (II) may be connected to the N atom in the general formula (I) directly or through a bridging structure which comprises at least one benzene ring. For example, FIG. 5B illustrates another structural formula of the second compound. The structural formula can be the complete structural formula of the second compound or a part of the complete structural formula of the second compound. In this structural formula, one carbon atom of the benzene ring in the general formula (II) is directly connected to the N atom, and the other two chemical bonds of the N atom are directly connected to the general formula (V) respectively.

Figure 5C:
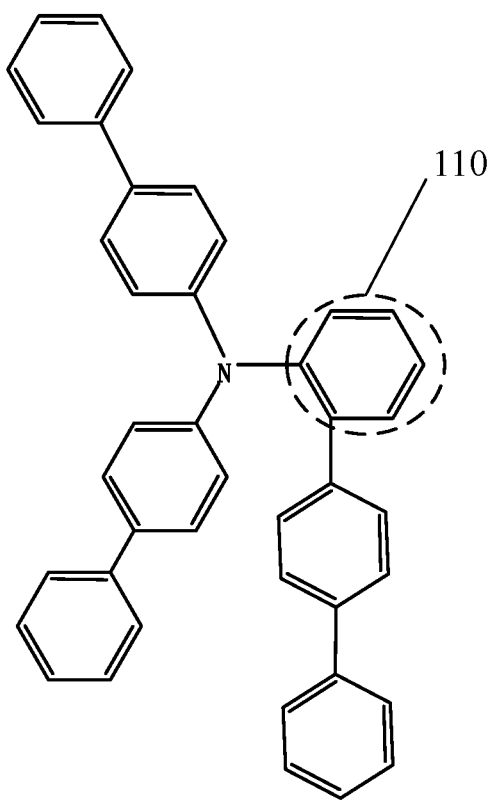
FIG. 5C illustrates still another (partial) structural formula of the second compound according to an embodiment of the present disclosure.
Figure 6A:
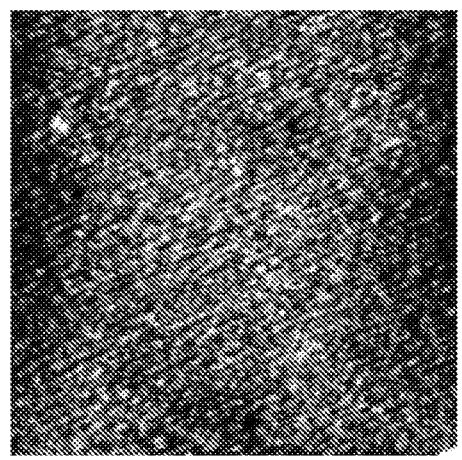
FIG. 6A-6E illustrate pictures of hole transport layers with different surface roughness according to embodiments of the present disclosure respectively.
Figure 6B:
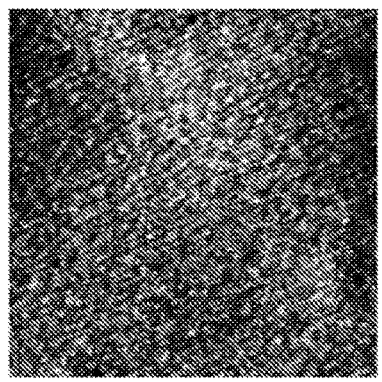
Figure 6C:
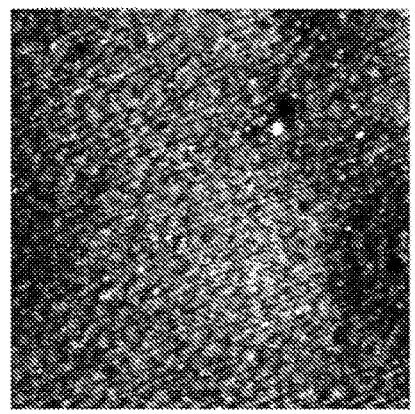
Figure 6D:
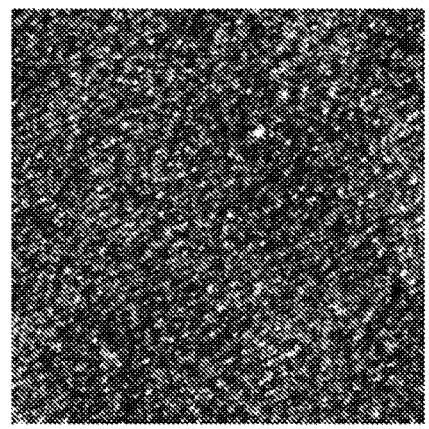
Figure 6E:
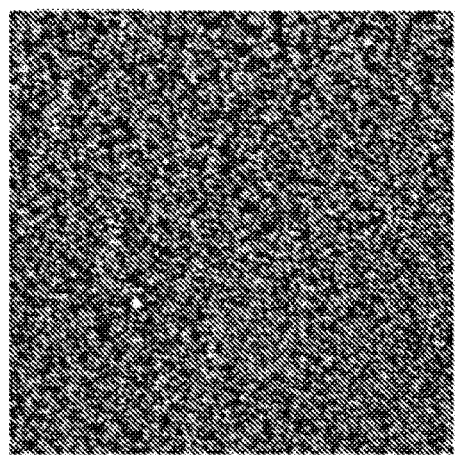

In some embodiments, when at least one of the groups $Ar_1\sim Ar_3$ is selected from the general formula (III), one carbon atom in the general formula (III) can be connected to the N atom in the general formula (I) directly or through a bridging structure which comprises at least one benzene ring. In some embodiments, when at least one of the groups $Ar_1\sim Ar_3$ is selected from the general formula (IV), one carbon atom in the general formula (IV) can be connected to the N atom in the general formula (I) directly or through a bridging structure which comprises at least one benzene ring. In some embodiments, when at least one of the groups $Ar_1\sim Ar_3$ is selected from the general formula (V), one carbon atom in the general formula (V) can be connected to the N atom in the general formula (I) directly or through a bridging structure which comprises at least one benzene ring. For example, FIG. 5C illustrates still another structural formula of the second compound. The structural formula can be the complete structural formula of the second compound or a part of the complete structural formula of the second compound. In this structural formula, the two chemical bonds of the N atom are directly connected to the general formula (V) respectively, and the other chemical bond of the N atom is connected to the general formula (V) through the bridging structure 110 illustrated by the dashed line. In FIG. 5C, the bridging structure 110 comprises one benzene ring. However, the bridging structure 110 is not limited to this. For example, it may also comprise any appropriate chemical structure such as two or more benzene rings, a combination of benzene rings and other chemical structures.

By selecting appropriate structural formulas (such as general formulas (II), (III), (IV), (V)) for the groups $Ar_1\sim Ar_3$ in the general formula (I), the second compound has appropriate performance parameters (such as HOMO energy level, hole mobility, solubility, etc.). The hole transport layer 105 is formed by mixing such a second compound with the above-mentioned first compound, so that the hole transport layer 105 has a sufficiently deep HOMO energy level, thereby reducing the energy barrier between the hole injection layer 107 and the hole transport layer 105 in the light-emitting device 100, increasing the hole injection, improving the hole injection ability, and improving the electron-hole recombination, so that the voltage of the light-emitting device 100 can be reduced and the current efficiency can be improved. Moreover, the second compound with a sufficiently deep HOMO energy level can also reduce the energy barrier between the hole transport layer 105 comprising the second compound and the light-emitting layer 104, thereby reducing the accumulation of holes at the interface between the hole transport layer 105 and the light-emitting layer 104, effectively slowing down the degradation process of the hole transport layer 105, prolonging the lifetime of the light-emitting device 100, and improving the stability of the light-emitting device 100.

In some embodiments, each of the aforementioned branched chains $R_1\sim R_7$ may be selected from any one of: a substituted or unsubstituted alkyl group/alkoxy group with 1~30 carbon atoms, a substituted or unsubstituted aryl group/aryloxy group with 6~40 carbon atoms, a substituted or unsubstituted aralkyl group with 7~40 carbon atoms. The aryl group can be, for example, any suitable chemical structure such as methyl and tert-butyl, and the aryl group can be, for example, any suitable chemical structure such as benzene ring, biphenyl, naphthalene. It should be noted that in this specification, terms such as "substituted or unsubstituted XX group" indicate that the H atom on the XX group may or may not be substituted. The H atom on the XX group can be replaced by any suitable chemical element or group, which is not limited in the embodiments of the present disclosure. For example, a halogen atom can be used to replace the H atom on the XX group. That is to say, some H atoms on the alkyl group/alkoxy group with 1~30 carbon atoms may be substituted by any other suitable element or group, or may not be substituted; some H atoms on the aryl group/aryloxy group with 6~40 carbon atoms may be substituted by any other suitable element or group, or may not be substituted; some H atoms on the aralkyl group with 7~40 carbon atoms may be substituted by any other suitable element or group, or may not be substituted.

Choosing such a branched chain structure can increase the solubility of the second compound and make it difficult to precipitate in the solution, so that the second compound and the first compound can be better mixed to improve the current efficiency and lifetime of the light-emitting device 100.

In some embodiments, the absolute value of the difference between the energy level of the highest occupied molecular orbital of the first compound and the energy level of the highest occupied molecular orbital of the second compound is greater than or equal to 0.2 eV, that is, $|HOMO_{first\ compound} - HOMO_{second\ compound}| \geq 0.2$ eV. In one example, $|HOMO_{first\ compound} - HOMO_{second\ compound}| \geq 0.2$ eV, for example 0.25 eV. In one example, $|HOMO_{first\ compound} - HOMO_{second\ compound}| \geq 0.3$ eV, for example 0.35 eV. In one example, $|HOMO_{first\ compound} - HOMO_{second\ compound}| \geq 0.4$ eV, for example 0.45 eV. In one example, $|HOMO_{first\ compound} - HOMO_{second\ compound}| \geq 0.5$ eV, for example 0.55 eV. In one example, $|HOMO_{first\ compound} - HOMO_{second\ compound}| \geq 0.6$ eV, for example 0.65 eV. In one example, $|HOMO_{first\ compound} - HOMO_{second\ compound}| \geq 0.7$ eV, for example 0.75 eV. In one example, $|HOMO_{first\ compound} - HOMO_{second\ compound}| \geq 0.8$ eV, for example 0.85 eV or 0.9 eV. In a preferred example, $0.2\ eV \leq |HOMO_{first\ compound} - HOMO_{second\ compound}| \leq 0.9$ eV. Such an energy level design enables an appropriate energy level difference between the first compound and the second compound. The appropriate energy level difference will not be too small to reflect the energy level collocation of the two compounds, nor will it be too large to prevent holes from being injected from the hole injection layer 107 to the hole transport layer 105. Such an energy level design is beneficial to improve hole injection and increase the recombination probability of electrons and holes. The absolute value of the HOMO energy level of the first compound is in the range of 5 eV~6 eV, and the absolute value of the HOMO energy level of the second compound is in the range of 5 eV~6.5 eV. In the hole transport layer 105, if one of the first compound and the second compound is selected to have a shallower HOMO energy level, the other is selected to have a deeper HOMO energy level, so that there is always an appropriate HOMO energy level difference between the first compound and the second compound. In one example, the first compound has a shallower HOMO energy level than the second compound, for example, $|HOMO_{first\ compound}| = 5.4$ eV, $|HOMO_{second\ compound}| = 6.0$ eV. In another example, the second compound has a shallower HOMO energy level than the first compound, for example, $|HOMO_{second\ compound}| = 5.3$ eV, $|HOMO_{first\ compound}| = 5.7$ eV. In the light-emitting device 100, the relationship among the HOMO energy levels of the hole injection layer 107, the hole transport layer 105, and the light-emitting layer 104 is: $|HOMO_{hole\ injection\ layer\ 107}| < |HOMO_{compound\ with\ a\ shallower\ HOMO\ energy\ level\ among\ the\ first\ compound\ and\ the\ second\ compound}| < |HOMO_{compound\ with\ a\ deeper\ HOMO\ level\ among\ the\ first\ compound\ and\ the\ second\ compound}| < |HOMO_{light-emitting\ layer\ 104}|$. There is an appropriate HOMO energy level difference between the first compound and the second compound, which is equivalent to "building" two gently progressive energy level transition bridges between the hole injection layer 107 and the light-emitting layer 104, which is beneficial for the holes to be injected from the hole injection layer 107 with a shallower HOMO energy level to the hole transport layer 105, and then from the hole transport layer 105 to the light-emitting layer 104 with a deeper HOMO energy level. Such an energy level design is beneficial to improve hole injection, thereby increasing the probability of recombination of electrons and holes, so that the voltage of the light-emitting device 100 can be reduced and the current efficiency can be improved.

In some embodiments, the hole mobility of the second compound is greater than or equal to $10^{-4}$ cm²/Vs, for example, greater than or equal to $10^{-3}$ cm²/Vs, greater than or equal to $10^{-2}$ cm²/Vs, greater than or equal to $10^{-1}$ cm²/Vs, and so on. It should be noted that in this specification, terms such as "the hole mobility of XX" refer to the inherent hole mobility of XX itself, that is, its own inherent properties, rather than the hole mobility of XX embodied in the light-emitting device 100. Generally, the light-emitting device 100 contains multiple film layers. Due to the influence of other materials between multiple film layers and in a single film layer, the hole mobility of XX embodied in the light-emitting device 100 and the inherent hole mobility of XX are usually different. Similarly, terms such as "the electron mobility of XX" refer to the inherent electron mobility of XX, that is, its own inherent properties, rather than the electron mobility of XX embodied in the light-emitting device 100. Since the second compound has a higher hole mobility, the hole transport layer 105 containing the second compound has a higher hole mobility, thereby reducing the difference between the injection/transport efficiency of holes and the injection/transport efficiency of electrons in the light-emitting device 100, improving the balance of electrons and holes in the light-emitting device 100, and improving the current efficiency and lifetime of the light-emitting device 100.

In some embodiments, the molar ratio of the first compound to the second compound is 1:1~100:1, for example, the molar ratio of the first compound to the second compound may be any appropriate ratio such as 100:1, 10:1, 10:3, 2:1, 1.5:1, 1:1. By mixing the first compound and the second compound at an appropriate molar ratio, the voltage of the light-emitting device 100 can be reduced, and the current efficiency of the light-emitting device 100 can be improved.

In some embodiments, the average surface roughness of the hole transport layer 105 is less than 5 nm, for example, less than 4 nm, less than 3 nm, less than 2 nm, less than 1 nm, and so on. Factors such as the doping ratio of the second compound in the first compound and the relative molecular mass of the second compound itself can affect the average surface roughness of the hole transport layer 105. The proper surface roughness of the hole transport layer 105 is beneficial to make other one or more film layers formed thereon (for example, the light-emitting layer 104, the electron transport layer 106, the cathode 103, etc.) relatively flat. Moreover, the proper surface roughness of the hole transport layer 105 will not cause it to pierce other film layers formed thereon, so that there will be no short circuit or material degradation in the light-emitting device, thereby improving the efficiency of the device.

Referring back to FIG. 1, the light-emitting layer 104 may be any suitable light-emitting layer. The material of the light-emitting layer 104 comprises an organic material or an inorganic material. In an example, the light-emitting layer 104 is a light-emitting layer formed of an organic material, so that the light-emitting device 100 comprising the light-emitting layer 104 is an organic light-emitting diode (OLED). In an example, the light-emitting layer 104 is a light-emitting layer formed of an inorganic material, for example, the inorganic material is a quantum dot, so that the light-emitting device 100 comprising the light-emitting layer 104 is a quantum dot light-emitting diode (QLED). Quantum dots have the advantages of high fluorescence quantum yield, narrow emission spectrum, adjustable emission spectrum, etc., and have broad application prospects in display and other fields. The material of the quantum dot may be any suitable material, and the embodiment of the present disclosure does not specifically limit the material of the quantum dot. For example, the material of the quantum dots can be II-VI group compounds, perovskites, III-V group compounds, I-III-VI group compounds, IV-VI group compounds, silicon-based quantum dots, carbon quantum dots, and the like. In one example, the absolute value of the HOMO energy level of the light-emitting layer 104 is in the range of 5.5 eV~6.5 eV. How to improve the efficiency and lifespan of QLEDs has always been the direction of continuous exploration and improvement in the industry. It is known that the fluorescence efficiency of some quantum dots can reach a higher level, but the optimization of QLED performance not only enhances the luminous efficiency of quantum dot materials, but also requires continuous improvement and optimization of various functional layers, and the matching effect between various functional layers. In the embodiment of the present disclosure, by making the hole transport layer 105 comprise the first compound and the second compound, the hole injection ability can be improved, the hole mobility can be improved, the voltage of the QLED device can be reduced, the accumulation of excitons at the interface between the hole transport layer 105 and the light-emitting layer 104 can be reduced, the deterioration process of the hole transport layer 105 can be effectively slowed down, thereby prolonging the lifetime of the light-emitting device 100 and improving its current efficiency.

The material of the anode 102 may comprise any suitable material, for example, a material having a high work function. In some embodiments, the material of the anode 102 comprises conductive metals or oxides thereof that are easy to inject holes, comprising but not limited to indium tin oxide (ITO), indium zinc oxide (IZO), aluminum, aluminum-doped zinc oxide, gold, silver, etc. Other suitable anode materials are also possible. When the light-emitting device 100 has a bottom emission structure, the material of the anode 102 may be transparent oxide material such as ITO, IZO, and the thickness of the film may be 80-200 nm. When the light-emitting device 100 has a top-emitting structure, the anode 102 may be made of a composite layer of transparent oxide, such as "Ag/ITO" or "Ag/IZO". In the composite layer of transparent oxide, the thickness of the metal layer (such as Ag) may be 80 nm-100 nm, and the thickness of the metal oxide layer (such as ITO or IZO) may be 5 nm-10 nm. The reference value of the average reflectance of the anode 102 in the visible light region may be, for example, 85%-95%.

The cathode 103 may comprise any suitable material. In some embodiments, the material of the cathode 103 can be selected from any one of ITO, aluminum, silver, gold, etc., which is not specifically limited in this embodiment.

Referring back to FIG. 1, the light-emitting device 100 may further comprise a hole injection layer (HIL) 107, which is between the anode 102 and the hole transport layer 105. The hole injection layer 107 can be used to reduce the hole injection barrier and improve the hole injection efficiency. In some embodiments, the hole injection layer 107 may comprise organic materials and/or inorganic materials. For example, the hole injection layer 107 can be formed of polystyrene sulfonate:poly(3,4-ethylenedioxythiophene) (PSS:PEDOT), $NiO_x$, etc., or the hole injection layer 107 can be formed by the p-type doping of the hole transport material. In some embodiments, the absolute value of the difference between the energy level of the highest occupied molecular orbital of the first compound and the energy level of the highest occupied molecular orbital of the hole injection layer 107 is less than or equal to 0.3 eV, that is $|HOMO_{first\ compound} - HOMO_{hole\ injection\ layer\ 107}| \leq 0.3$ eV, and/or, the absolute value of the difference between the energy level of the highest occupied molecular orbital of the second compound and the energy level of the highest occupied molecular orbital of the hole injection layer 107 is less than or equal to 0.3 eV, that is $|HOMO_{second\ compound} - HOMO_{hole\ injection\ layer\ 107}| \leq 0.3$ eV. For the hole transport layer 105 as a whole, as a whole film layer composed of the first compound and the second compound, it reflects a whole HOMO energy level. The "HOMO energy level of the hole transport layer 105" mentioned below refers to the HOMO energy level of the hole transport layer 105 as a whole. In some embodiments, the absolute value of the difference between the energy level of the highest occupied molecular orbital of the hole injection layer 107 and the energy level of the highest occupied molecular orbital of the hole transport layer 105 is less than 0.40 eV, that is $|HOMO_{hole\ transport\ layer\ 105} - HOMO_{hole\ injection\ layer\ 107}| < 0.40$ eV, preferably less than 0.30 eV, less than 0.20 eV, less than or equal to 0.11 eV, etc. Through such a HOMO energy level design, the energy level barrier between the hole injection layer 107 and the hole transport layer 105 can be reduced, and the hole injection efficiency can be improved. In some embodiments, the absolute value of the difference between the energy level of the highest occupied molecular orbital of the hole transport layer 105 and the energy level of the highest occupied molecular orbital of the light-emitting layer 104 is less than 0.40 eV, that is $|HOMO_{light-emitting\ layer\ 104} - HOMO_{hole\ transport\ layer\ 105}| < 0.40$ eV, preferably less than 0.30 eV, less than 0.20 eV, less than 0.10 eV, etc.

With continued reference to FIG. 1, the light-emitting device 100 may further comprise an electron transport layer 106, which is between the cathode 103 and the light-emitting layer 104. The material of the electron transport layer comprises a metal oxide containing at least two metal materials. In some embodiments, the at least two metals comprise Zn and at least one selected from Mg, Al, Ti, Zr, Li, etc., and a value of the molar ratio of Zn to metal oxide is greater than or equal to 0.7. For example, in one example, the metal oxide is ZnO doped with Mg, and the value of the molar ratio of Mg to the metal oxide is 0.15. As mentioned above, in conventional light-emitting devices, the injection/transport efficiency of electrons is generally higher than the injection/transport efficiency of holes, resulting in an imbalance of electrons and holes in the device. In the embodiment of the present disclosure, by doping the ZnO with a suitable proportion of Mg in the electron transport layer 106, the energy level of the lowest unoccupied molecular orbital (LUMO) (also called the conduction band bottom) of the electron transport layer 106 and the work function of the cathode 103 can have a large difference. Therefore, the transmission of electrons can be suppressed to a certain extent, so that the electrons and holes in the light-emitting device which otherwise would be in excess of electrons gradually tend to balance, thereby improving the current efficiency of the light-emitting device.

In some embodiments, the electron mobility of the electron transport layer 106 is greater than or equal to $10^{-4}$ $cm^2/Vs$, for example, greater than or equal to $10^{-3}$ $cm^2/Vs$, greater than or equal to $10^{-2}$ $cm^2/Vs$, and so on. In some embodiments, $10^{-2} \leq$ the hole mobility of at least one of the first compound and the second compound: the electron mobility of the electron transport layer $106 \leq 10^2$. In one example, the hole mobility of the first compound is $4.5*10^{-6}$ cm$^2$/Vs, the hole mobility of the second compound is $1*10^{-3}$ cm$^2$/Vs, and the electron mobility of the electron transport layer 106 is $1.6*10^{-3}$ cm$^2$/Vs. The first compound, the second compound and the electron transport layer 106 have suitable mobility by selecting suitable materials for them. Thereby, the difference between the injection/transport efficiency of electrons and the injection/transport efficiency of holes can be reduced, and thus the recombination probability of electrons and holes in the light-emitting device 100 can be improved.

The light-emitting device 100 may further comprise a substrate 101. The substrate 101 may be rigid or flexible. The substrate 101 may be a substrate of any suitable material, such as a plastic substrate, a metal substrate, a semiconductor wafer substrate, and a glass substrate. The substrate 101 usually has a smooth surface to facilitate the formation of subsequent film layers thereon. The light-emitting device 100 may further comprise at least one of a hole blocking layer and an electron blocking layer or any other required film layers as required, which is not specifically limited in the embodiments of the present disclosure.

Several specific examples of the light-emitting device 100 are illustrated below to compare the effects of different mixing ratios of the first compound and the second compound on the performance of the light-emitting device 100.

Example 1

The parameters of each layer in the light-emitting device are as follows: the hole transport layer 105 (abbreviated as HTL$_1$) comprises a first compound and a second compound. The material of the first compound is PVK, and the absolute value of the HOMO energy level of the second compound is 5.38 eV. The molar ratio of the first compound to the second compound is 10:1. The thickness of the hole transport layer HTL$_1$ is about 35~40 nm. The material of the hole injection layer 107 is poly(3, 4-ethylenedioxythiophene) (PEDOT), and its thickness is about 40~45 nm. The material of the light-emitting layer 104 is CdSe quantum dot emitting red light, and its thickness is about 10~20 nm. The material of the electron transport layer 106 is ZnMgO, and its thickness is about 30~60 nm. The material of the anode 102 is ITO, and its thickness is about 40~45 nm. The material of the cathode 103 is Al, and its thickness is about 100 nm. In this example 1, the hole mobility of the first compound is $4.5*10^{-6}$ cm$^2$/Vs, the hole mobility of the second compound is $1*10^{-3}$ cm$^2$/Vs, and the electron mobility of the electron transport layer 106 is $1.6*10^{-3}$ cm$^2$/Vs.

Example 2

In this example 2, except for the different molar ratio of the first compound to the second compound in the hole transport layer (abbreviated as HTL$_2$), the film layer parameters of the light-emitting device in this example are exactly the same as those of the light-emitting device in example 1. The material of the first compound in HTL$_2$ is PVK, and the molar ratio of the first compound to the second compound is 10:3.

Example 3

In this example 3, except for the different molar ratio of the first compound to the second compound in the hole transport layer (abbreviated as HTL$_3$), the film layer parameters of the light-emitting device in this example are exactly the same as those of the light-emitting device in example 1. The material of the first compound in HTL$_3$ is PVK, and the molar ratio of the first compound to the second compound is 2:1.

Example 4

In this example 4, except for the different molar ratio of the first compound to the second compound in the hole transport layer (abbreviated as HTL$_4$), the film layer parameters of the light-emitting device in this example are exactly the same as those of the light-emitting device in example 1. The material of the first compound in HTL$_4$ is PVK, and the molar ratio of the first compound to the second compound is 1:1.

Comparative Example 1

In the comparative example 1, except for the material of the hole transport layer (abbreviated as HTL$_{comparative\ 1}$), the film layer parameters of the light-emitting device in this comparative example are exactly the same as those of the light-emitting device in example 1. HTL$_{comparative\ 1}$ only comprises the first compound of which the material is PVK, and does not comprise the second compound.

The following Table 1 illustrates the physical properties of partial layers of the light-emitting devices in examples 1~4 and comparative example 1; Table 2 shows the performance parameters of the light-emitting devices in examples 1~4 and comparative example 1.

TABLE 1

Physical properties of partial layers of the light-emitting device

| Material | Absolute value of HOMO energy level (eV) | Material | Absolute value of LUMO Energy Level (eV) |
| --- | --- | --- | --- |
| HIL | 5.2 | ETL$_{comparative\ 2}$ | 3.6 |
| HTL$_{comparative\ 1}$ | 5.82 | ETL$_5$ | 3.47 |
| HTL$_1$ | 5.74 | ETL$_6$ | 3.32 |
| HTL$_2$ | 5.58 | ETL$_7$ | 3.21 |
| HTL$_3$ | 5.41 | ETL$_8$ | 3.08 |
| HTL$_4$ | 5.31 | | |
| second compound | 5.38 | | |

TABLE 2

Performance parameters of light-emitting devices

| Light-emitting Devices | Voltage (V) | Current Efficiency (cd/A) | $L_{max}$ (cd/cm$^2$) | EL (nm) | FWHM(nm) | Average Surface Roughness of Hole Transport Layer (nm) |
|---|---|---|---|---|---|---|
| Comparative example 1 | 4.1 | 12.3 | 1110 | 622 | 26 | 0.653 |
| Example 1 | 3.5 | 13.8 | 4978 | 622 | 25 | 0.687 |
| Example 2 | 2.6 | 15.4 | 26542 | 622 | 25 | 0.792 |
| Example 3 | 2.4 | 20.3 | 75469 | 622 | 25 | 0.919 |
| Example 4 | 2.4 | 14.0 | 24917 | 622 | 25 | 1.398 |

It can be seen from Table 1 that in the order of $HTL_{comparative\ 1}$, $HTL_1$, $HTL_2$, $HTL_3$, and $HTL_4$ in the table, the absolute value of the HOMO energy level of the hole transport layer gradually decreases. That is, as the mole ratio of the second compound in the hole transport layer gradually increases, the absolute value of the HOMO energy level of the hole transport layer gradually decreases. For example, when the hole transport layer only comprises the first compound but not the second compound, i.e., $HTL_{comparative\ 1}$, the absolute value of the HOMO energy level of the hole transport layer is 5.82 eV; when the mole ratio of the second compound in the hole transport layer is the highest, i.e., $HTL_4$, the absolute value of the HOMO energy level of the hole transport layer is 5.31 eV.

It can be seen from Table 2 that in the order from comparative example 1 to example 4, the voltage of the light-emitting device gradually decreases. In example 3, the voltage of the light-emitting device is dropped to the lowest value of 2.4V, and the voltage of the light-emitting device in example 4 is the same as the voltage of the light-emitting device in example 3, which is also 2.4V. In the order from comparative example 1 to example 4, the current efficiency of the light-emitting device gradually increases and then decreases. In example 3, the current efficiency of the light-emitting device rises to the highest value of 20.3 cd/A, and then in example 4, the current efficiency of the light-emitting device decreases to 14.0 cd/A. In the order from comparative example 1 to example 4, the brightness of the light-emitting device gradually increases and then decreases. In example 3, the brightness of the light-emitting device rises to the maximum value of 75469 cd/cm$^2$, and then in example 4, the brightness of the light-emitting device decreases to 24917 cd/cm$^2$. In the order from comparative example 1 to example 4, the average surface roughness of the hole transport layer gradually increases, which is the smallest in comparative example 1, with an average surface roughness of 0.653 nm, and the largest in example 4, with an average surface roughness of 1.398 nm. FIGS. 6A-6E illustrate pictures of hole transport layers with different average surface roughness in comparative example 1, example 1, example 2, example 3, and example 4, respectively. In the order from comparative example 1 to example 4, the doping ratio of the second compound gradually increases. In comparative example 1, the hole transport layer is not doped with the second compound; in example 1, the molar ratio of the first compound to the second compound is 10:1; in example 2, the molar ratio of the first compound to the second compound is 10:3; in example 3, the molar ratio of the first compound to the second compound is 2:1; in example 4, the molar ratio of the first compound to the second compound is 1:1. The reason for the performance parameters shown in Table 2 is that because the second compound has a higher hole mobility and a deeper HOMO energy level, as the doping ratio of the second compound increases, the energy barrier between the hole injection layer 107 and the hole transport layer 105 is reduced, hole injection is increased, and electron-hole recombination is improved, thereby reducing the voltage of the light-emitting device 100 and increasing the current efficiency. When the molar ratio of the first compound to the second compound is 2:1 (i.e., in example 3), the voltage drops to the lowest value and the current efficiency rises to the highest value. When the doping ratio of the second compound is too high (i.e., in example 4), the current efficiency decreases, this is because the too high doping ratio of the second compound will cause the average surface roughness of the hole transport layer 105 to be too large. The too rough surface of the hole transport layer 105 will pierce other film layers formed thereon, causing problems such as short circuits or material degradation in the light-emitting device, thereby causing the current efficiency of the light-emitting device to decrease. It can be seen from Table 2 that the emission wavelength (EL) of the light-emitting devices in each example is the same, which is 622 nm. Except that the full width at half maximum (FWHM) of the light-emitting device in comparative example 1 is 26 nm, the FWHM of the light-emitting device in other examples is 25 nm.

Figure 7:
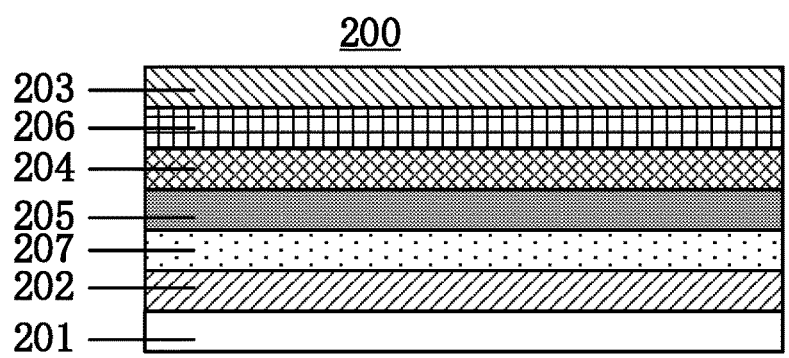
FIG. 7 illustrates a structure of a light-emitting device according to an embodiment of the present disclosure.

According to another aspect of the present disclosure, another light-emitting device is provided. FIG. 7 illustrates a light-emitting device 200, which comprises an anode 202, a cathode 203, a light-emitting layer 204 between the anode 202 and the cathode 203, and an electron transport layer 206 between the cathode 203 and the light-emitting layer 204. The material of the electron transport layer 206 comprises a metal oxide containing at least two metals.

By making the electron transport layer 206 comprise a metal oxide containing at least two metals, the transport of electrons can be suppressed to a certain extent, so that the phenomenon of excessive electrons in the light-emitting device is alleviated, which is beneficial to make the electrons and holes in the light-emitting device 200 gradually tend to be balanced, thereby effectively improving the current efficiency of the light-emitting device 200.

In some embodiments, the electron mobility of the electron transport layer 206 is greater than or equal to $10^{-4}$ cm$^2$/Vs. The at least two metals comprise Zn and at least one selected from Mg, Al, Ti, Zr, and Li, and the value of the molar ratio of Zn to the metal oxide is greater than or equal to 0.7. In one example, the metal oxide is ZnO doped with Mg, and the value of the molar ratio of Mg to the metal oxide is 0.15. By doping the ZnO with a proper proportion of Mg in the electron transport layer 206, the LUMO energy level of the electron transport layer 206 and the work function of the cathode 203 can have a larger difference. As a result, the transport of electrons can be suppressed to a certain extent, so that the electrons and holes gradually tend to be balanced, thereby improving the current efficiency of the light-emitting device 200.

The light-emitting device 200 further comprises a hole transport layer 205, and the hole transport layer 205 is between the anode 201 and the light-emitting layer 204. The hole transport layer 205 may only comprise the first compound as described above, such as PVK, TFB, Poly-TPD, etc., or may comprise both the first compound and the second compound. For the material of the first compound and the material of the second compound, reference may be made to the foregoing description, which is not repeated in the embodiments of the present disclosure.

The anode 202, the cathode 203, and the light-emitting layer 204 may be the same as the anode 102, the cathode 103, and the light-emitting layer 104 described above, respectively. The light-emitting device 200 may further comprise a substrate 201 and a hole injection layer 207, which may be the same as the substrate 101 and the hole injection layer 107 described above. For the sake of simplicity, the embodiments of the present disclosure will not be repeated.

Several examples of the light-emitting device 200 are illustrated below to compare the effects of different doping ratios of Mg in the electron transport layer 206 on the performance of the light-emitting device 200.

Example 5

The parameters of each layer in the light-emitting device are as follows: the material of the electron transport layer 206 (abbreviated as $ETL_5$) is a metal oxide, the metal oxide is ZnO doped with Mg. The value of the molar ratio of Mg to metal oxide is 0.05, the thickness of the electron transport layer 206 is about 30~60 nm. The hole transport layer 205 only comprises the first compound Poly-TPD, and its thickness is about 35~40 nm. The material of the hole injection layer 207 is poly(3,4-ethylenedioxythiophene) (PEDOT), and its thickness is about 40~45 nm. The material of the light-emitting layer 204 is CdSe quantum dot emitting red light, and its thickness is about 10~20 nm. The material of the anode 202 is ITO, and its thickness is about 40~45 nm. The material of the cathode 203 is Al, and its thickness is about 100 nm.

Example 6

In this example 6, except for the different doping ratio of Mg in the electron transport layer (abbreviated as $ETL_6$), the film layer parameters of the light-emitting device in this example are exactly the same as those of the light-emitting device in example 5. The material of $ETL_6$ is ZnO doped with Mg, and the value of the molar ratio of Mg to metal oxide is 0.10.

Example 7

In this example 7, except for the different doping ratio of Mg in the electron transport layer (abbreviated as $ETL_7$), the film layer parameters of the light-emitting device in this example are exactly the same as those of the light-emitting device in example 5. The material of $ETL_7$ is ZnO doped with Mg, and the value of the molar ratio of Mg to metal oxide is 0.15.

Example 8

In this example 8, except for the different doping ratio of Mg in the electron transport layer (abbreviated as $ETL_8$), the film layer parameters of the light-emitting device in this example are exactly the same as those of the light-emitting device in example 5. The material of $ETL_8$ is ZnO doped with Mg, and the value of the molar ratio of Mg to metal oxide is 0.20.

Comparative Example 2

In this comparative example 2, except for the different material of the electron transport layer (abbreviated as $ETL_{comparative\ 2}$), the film layer parameters of the light-emitting device in this comparative example 2 are exactly the same as those of the light-emitting device in example 5. $ETL_{comparative\ 2}$ only comprises ZnO, without Mg doping.

The following Table 3 illustrates the performance parameters of the light-emitting devices in examples 5~8 and comparative example 2.

TABLE 3

| Performance parameters of light-emitting devices | | | | |
|---|---|---|---|---|
| Light-emitting Devices | Voltage (V) | Current Efficiency (cd/A) | L(cd/cm$^2$) | EL (nm) | FWHM(nm) |
| Comparative example 2 | 2.7 | 5.4 | 818 | 622 | 26 |
| Example 5 | 2.5 | 12.2 | 2105 | 622 | 25 |
| Example 6 | 2.4 | 24.4 | 3645 | 621 | 25 |
| Example 7 | 2.6 | 40.4 | 6254 | 622 | 25 |
| Example 8 | 2.5 | 32.3 | 4957 | 622 | 25 |

Referring to Table 1 shown above, in the order of $ETL_{comparative\ 2}$, $ETL_5$, $ETL_6$, $ETL_7$, $ETL_8$ in the table, the absolute value of the LUMO energy level of the electron transport layer gradually decreases. In other words, as the molar ratio of Mg in the metal oxide gradually increases, the absolute value of the LUMO energy level of the electron transport layer gradually decreases, resulting in the difference between the LUMO energy level of the electron transport layer and the work function of the cathode 203 becomes larger and larger. For example, when Mg is not doped in the electron transport layer, i.e., $ETL_{comparative\ 2}$, the absolute value of the LUMO energy level of the electron transport layer is 3.6 eV; when the doping ratio of Mg in the electron transport layer is the highest, i.e., $ETL_8$, the absolute value of the LUMO energy level of the electron transport layer is 3.08 eV.

It can be seen from Table 3 that in the order from comparative example 2 to example 8, the voltage of the light-emitting device gradually decreases and then rises again. In example 6, the voltage of the light-emitting device drops to the lowest value of 2.4V, and the voltage of the light-emitting device in example 7 and example 8 are 2.6V and 2.5V, respectively. In the order from comparative example 2 to example 8, the current efficiency of the light-emitting device gradually increases and then decreases. In example 7, the current efficiency of the light-emitting device rises to the highest value of 40.4 cd/A, and then in example 8, the current efficiency of the light-emitting device decreases to 32.3 cd/A. In the order from comparative example 2 to example 8, the brightness of the light-emitting device gradually increases and then decreases. In example 7, the brightness of the light-emitting device rises to the highest value of 6254 cd/cm$^2$, and then the brightness of the light-emitting device decreases in example 8 to 4957 cd/cm$^2$. In the order from comparative example 2 to example 8, the doping ratio of Mg in the electron transport layer gradually increases. It is 0 in the comparative example 2, is 0.05 in example 5, is 0.10 in example 6, is 0.15 in example 7, and is 0.20 (molar ratio) in example 8. The reason for the performance parameters shown in Table 3 is that with the increase of the doping ratio of Mg, the difference between the LUMO energy level of the electron transport layer and the work function of the cathode 203 becomes larger and larger, which suppresses the electron transport to a certain extent, so that the electrons and holes in the light-emitting device, which otherwise would be in excess of electrons, gradually tend to balance, resulting in a gradual increase in the current efficiency of the light-emitting device 200. When the value of the molar ratio of Mg to the metal oxide is 0.15 (i.e., in example 7), the current efficiency of the light-emitting device 200 reaches the maximum value of 40.4 cd/A. However, when the doping ratio of Mg is too high (i.e., in example 8), the electron transport is lower than the hole transport in the light-emitting device due to excessive suppression of the electron transport, resulting in a carrier imbalance in the light-emitting device again. As a result, the current efficiency of the light-emitting device begins to decrease. It can be seen from Table 3 that, except that the emission wavelength of the light-emitting device in example 6 is 621 nm, the emission wavelengths of the light-emitting devices in the other examples are all the same, which are all 622 nm. Except that the FWHM of the light-emitting device in comparative example 2 is 26 nm, the FWHM of the light-emitting device in the other examples is all 25 nm.

When the hole transport layer 205 in the light-emitting device 200 comprises both the first compound and the second compound as described above, the light-emitting device 200 may also have substantially the same technical effects as the light-emitting device 100. Therefore, for the sake of brevity, the description will not be repeated here.

Figure 8:
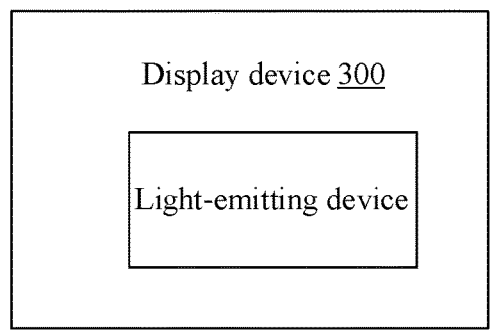
FIG. 8 illustrates a block diagram of a display device according to an embodiment of the present disclosure.

According to still another aspect of the present disclosure, a display device is provided. FIG. 8 illustrates a block diagram of a display device 300, which may comprise the light-emitting device 100 or 200 described in any of the previous embodiments.

The display device 300 can have basically the same technical effects as the light-emitting device 100 or 200 described in the previous embodiment, and therefore, for the sake of brevity, the description will not be repeated here.

Figure 9:
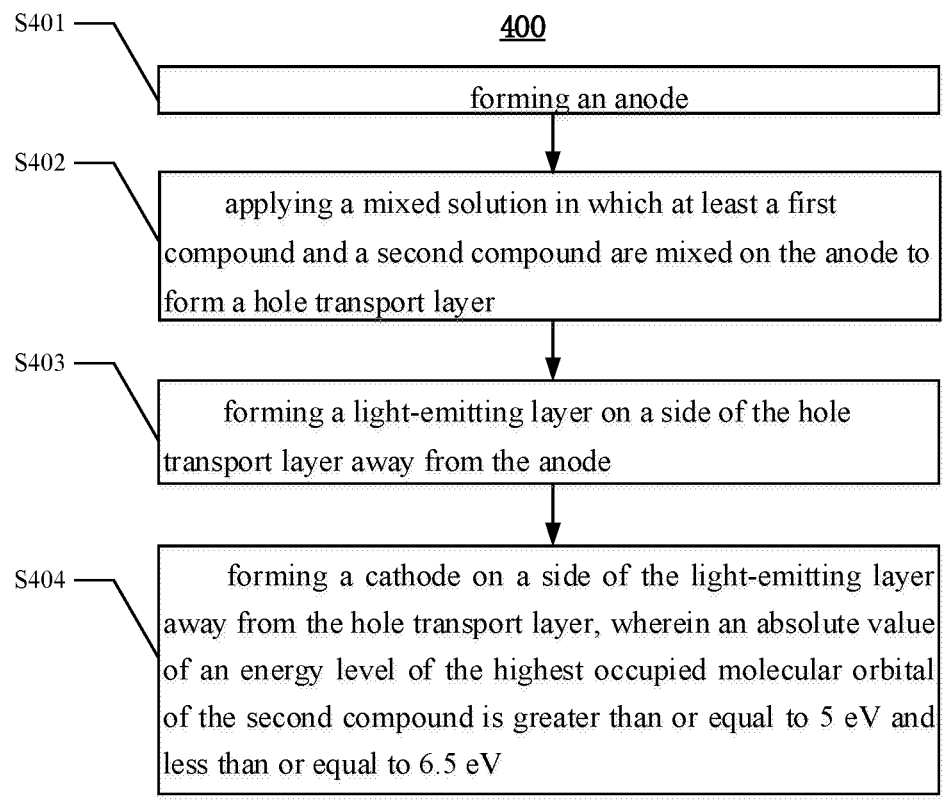
FIG. 9 illustrates a flowchart of a method of manufacturing a light-emitting device according to an embodiment of the present disclosure.

According to still another aspect of the present disclosure, a method of manufacturing a light-emitting device is provided. This method can be used to manufacture the light-emitting device 100 described in any of the previous embodiments. FIG. 9 illustrates a flowchart of a method of manufacturing the above-mentioned light-emitting device 100. The manufacturing method 400 will be described below with reference to FIG. 1 and FIG. 9.

Step S401: forming an anode 102;

Step S402: applying a mixed solution in which at least a first compound and a second compound are mixed on the anode 102 to form a hole transport layer 105;

Step S403: forming a light-emitting layer 104 on a side of the hole transport layer 105 away from the anode 102; and Step S404: forming a cathode 103 on a side of the light-emitting layer 104 away from the hole transport layer 105, wherein an absolute value of an energy level of the highest occupied molecular orbital of the second compound is greater than or equal to 5 eV and less than or equal to 6.5 eV.

In some embodiments, step S402 comprises the following sub-step S4021:

mixing the first compound and the second compound in a molar ratio of 1:1~100:1 to obtain the mixed solution; and applying the mixed solution on the anode 102 to form the hole transport layer 105 by means of coating, printing or electrohydrodynamic jet printing. The "coating" here comprises any suitable ways such as spin coating, spray coating, and blade coating.

In some embodiments, the sub-step S4021 may be: mixing the first compound formed of polyvinyl carbazole and the second compound at a molar ratio of 2:1 to obtain the mixed solution; and spin coating the mixed solution on the anode 102 to form the hole transport layer 105.

Hereinafter, the method of manufacturing the light-emitting device 100 will be described in detail by taking the light-emitting device in example 3 described above as an example.

First, a substrate 101 is provided, and the substrate 101 may be formed of any suitable material. The substrate 101 is cleaned, and then a conductive film layer of indium tin oxide (ITO) is deposited and patterned on the substrate 101 to form the anode 102. The thickness of the anode 102 is about 40~45 nm. Then, the cleaned substrate 101 carrying the anode 102 is subjected to ultraviolet ozone (UVO) treatment for about 15 minutes, and then transferred to a glove box filled with nitrogen protection. The hole injection material solution is spin-coated on the surface carrying the anode 102, and the hole injection material is poly(3, 4-ethylenedioxythiophene) (PEDOT). The rotation speed is about 3000 rpm, and after rotating for about 40 seconds, it is baked at 130° C. for about 20 minutes and placed at room temperature to form the hole injection layer 107. The thickness of the resulting hole injection layer 107 is about 40~45 nm. Afterwards, the pre-mixed mixed solution of hole transport materials is spin-coated on the hole injection layer 107 at a rotation speed of about 3000 rpm, and after rotating for about 40 seconds, baking at 130° C. for 20 minutes to form the hole transport layer 105. The thickness of the hole transport layer 105 is about 35~40 nm. The step of premixing the mixed solution of the hole transport material may comprise: first dissolving a certain molar amount of the first compound PVK in a solvent to form a solution. The solvent may be any suitable organic solvent, such as alcohols, methane, toluene, chlorobenzene, etc. Then a certain molar amount of the second compound is added to the solution, so that the molar ratio of the first compound to the second compound is 2:1, thereby forming the mixed solution of hole transport materials. Next, the CdSe quantum dot solution is spin-coated on the resulting hole transport layer 107 at a rotation speed of about 4000 rpm, and after rotating for about 40 seconds, annealed at 100° C. for about 10 minutes to form the light-emitting layer 104. The thickness of the resulting light-emitting layer 104 is about 10~20 nm. Then the ZnMgO solution is spin-coated on the light-emitting layer 104 at a rotation speed of about 3000 rpm, and after rotating for about 40 seconds, baked at 100° C. for 10 minutes to form the electron transport layer 106, and the thickness of the resulting electron transport layer 106 is about 30~60 nm. Finally, aluminum is vapor-deposited on the electron transport layer 106 and patterned to form the cathode 103, and the thickness of the resulting cathode 103 is about 100 nm.

The method 400 can have basically the same technical effects as the light-emitting device 100 described in the previous embodiments, and therefore, for the sake of brevity, the description will not be repeated here.

The method of manufacturing the light-emitting device 200 is basically the same as that of manufacturing the light-emitting device 100. The method 500 of manufacturing the light-emitting device 200 is described below with reference to FIG. 8:

Step S501: forming an anode 202;

Step S502: forming a light-emitting layer 204 on the anode 202;

Step S503: applying a metal oxide film layer comprising at least two metals on a side of the light-emitting layer 204 away from the anode 202 to form an electron transport layer 206; and Step S504: forming a cathode 203 on a side of the electron transport layer 206 away from the light-emitting layer 204.

Hereinafter, the method of manufacturing the light-emitting device 200 will be described in detail by taking the light-emitting device in example 7 described above as an example.

First, a substrate 101 is provided, and the substrate 101 may be formed of any suitable material. The substrate 101 is cleaned, and then a conductive film layer of indium tin oxide (ITO) is deposited and patterned on the substrate 101 to form the anode 202. The thickness of the anode 202 is about 40~45 nm. Then, the cleaned substrate 101 carrying the anode 202 is subjected to ultraviolet ozone (UVO) treatment for about 15 minutes, and then transferred to a glove box filled with nitrogen protection. A hole injection material solution is spin-coated on the surface carrying the anode 202, and the hole injection material is poly(3,4-ethylenedioxythiophene) (PEDOT). The rotation speed is about 3000 rpm, and after rotating for about 40 seconds, it is baked at 130° C. for about 20 minutes and placed at room temperature to form the hole injection layer 207. The thickness of the resulting hole injection layer 207 is about 40~45 nm. Afterwards, a hole transport material solution containing the first compound Poly-TPD is spin-coated on the hole injection layer 107 at a rotation speed of about 3000 rpm, after rotating for about 40 seconds, baked at 130° C. for about 20 minutes to form the hole transport layer 205. The thickness of the hole transport layer 205 is about 35~40 nm. Next, the CdSe quantum dot solution is spin-coated on the hole transport layer 205 at a rotation speed of about 4000 rpm, and after rotating for about 40 seconds, annealed at 100° C. for 10 minutes to form the light-emitting layer 204. The thickness of the resulting light-emitting layer 204 is about 10~20 nm. Then, a metal oxide solution is spin-coated on the light-emitting layer 204, the metal oxide is ZnO doped with Mg, and the value of the molar ratio of Mg to the metal oxide is 0.15. The rotation speed of the spin-coating of the metal oxide solution is about 3000 rpm, and after rotating for about 40 seconds, it is baked at 100° C. for 10 minutes to form the electron transport layer 206. The thickness of the resulting electron transport layer 206 is about 30~60 nm. Finally, aluminum is vapor-deposited on the electron transport layer 206 and patterned to form the cathode 203. The thickness of the resulting cathode 203 is about 100 nm.

The method 500 can have basically the same technical effects as the light-emitting device 200 described in the previous embodiments, and therefore, for the sake of brevity, the description will not be repeated here.

It should be noted that although the method described in the embodiment of the present disclosure is used to form a light-emitting device with a forward structure, this is only exemplary and not restrictive. The structure of the light-emitting device with an inverted structure and the manufacturing method thereof are also covered within the protection scope of this disclosure. The manufacturing method of the light-emitting device with the inverted structure is basically the same as the method 400 or the method 500 described above, and the manufacturing sequence only needs to be adjusted slightly. For example, a method of forming a light-emitting device with an inverted structure may comprise: providing a substrate; forming a cathode on the substrate; forming an electron transport layer on a side of the cathode away from the substrate; forming a light-emitting layer on a side of the electron transport layer away from the cathode; forming a hole transport layer on a side of the light emitting layer away from the electron transport layer; forming a hole injection layer on a side of the hole transport layer away from the light emitting layer; and forming an anode on a side of the hole injection layer away from the hole transport layer.

In the description of the present disclosure, the terms "upper", "lower", "left", "right", etc. indicate the orientation or positional relationship based on the orientation or positional relationship shown in the drawings, and are only used to facilitate the description of the present disclosure. It is not required that the present disclosure must be constructed and operated in a specific orientation, and therefore these terms cannot be understood as a limitation to the present disclosure.

In the description of this specification, the description with reference to the terms "one embodiment", "another embodiment", etc. means that a specific feature, structure, material, or characteristic described in conjunction with the embodiment is comprised in at least one embodiment of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, those skilled in the art can combine the different embodiments or examples and the features of the different embodiments or examples described in this specification without contradicting each other. In addition, it should be noted that in this specification, the terms "first" and "second" are only used for descriptive purposes, and cannot be understood as indicating or implying relative importance or implicitly indicating the number of indicated technical features.

As those skilled in the art will understand, although the various steps of the method in the present disclosure are described in a specific order in the accompanying drawings, this does not require or imply that these steps must be performed in the specific order, unless the context clearly dictates otherwise. Additionally or alternatively, multiple steps can be combined into one step for execution, and/or one step can be decomposed into multiple steps for execution. In addition, other method steps can be inserted between the steps. The inserted step may represent an improvement of the method such as described herein, or may be unrelated to the method. In addition, a given step may not be fully completed before the next step starts.

The above are only specific implementations of the present disclosure, but the protection scope of the present disclosure is not limited thereto. The changes or substitutions which any person skilled in the art can easily think of within the technical scope disclosed in the present disclosure should be covered by the protection scope of the present disclosure. Therefore, the protection scope of the present disclosure should be subject to the protection scope of the claims.

The invention claimed is:

1. A light-emitting device comprising:
an anode;
a cathode;
a light-emitting layer between the anode and the cathode; and
a hole transport layer between the anode and the light-emitting layer,
wherein the hole transport layer comprises a first compound and a second compound, and
wherein an absolute value of an energy level of the highest occupied molecular orbital of the second compound is greater than or equal to 5 eV and less than or equal to 6.5 eV,
wherein a hole mobility of the second compound is greater than or equal to $10^{-4}$ cm$^2$/Vs.

2. The light-emitting device of claim 1, wherein an absolute value of a difference between an energy level of the highest occupied molecular orbital of the first compound and the energy level of the highest occupied molecular orbital of the second compound is greater than or equal to 0.2 eV.

3. The light-emitting device of claim 1, wherein a molar ratio of the first compound to the second compound is 1:1~100:1.

4. The light-emitting device of claim 1, wherein a general formula (I) of the second compound is:

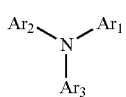
(I)

wherein at least one of the groups $Ar_1 \sim Ar_3$ comprises aryl or heteroaryl materials.

5. The light-emitting device of claim 4, wherein a relative molecular mass of the second compound is less than 4000.

6. The light-emitting device of claim 4,
wherein in the general formula (I), at least one of the groups $Ar_1 \sim Ar_3$ is selected from a general formula (II) or a general formula (III),
wherein the general formula (II) is:

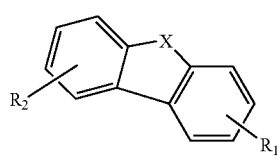
(II)

X is selected from any one of O, N, S, and C; one carbon atom in the general formula (II) or the X atom is connected to the N atom in the general formula (I), and the one carbon atom in the general formula (II) refers to one of six carbon atoms of two benzene rings in the general formula (II), and the six carbon atoms refer to three carbon atoms of the benzene ring on a right side of a five-membered ring in the general formula (II) except those connected to the branched chain $R_1$ and the five-membered ring plus three carbon atoms of the benzene ring on a left side of the five-membered ring in the general formula (II) except those connected to the branched chain $R_2$ and the five-membered ring, and wherein the general formula (III) is:

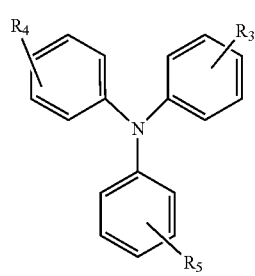
(III)

one carbon atom in the general formula (III) is connected to the N atom in the general formula (I), and the one carbon atom in the general formula (III) refers to any one of the remaining twelve carbon atoms of three benzene rings in the general formula (III) except those respectively connected to the branched chains $R_3$, $R_4$, $R_5$ and the N atom,
wherein each of the branched chains $R_1 \sim R_5$ is selected from any one of: substituted or unsubstituted alkyl/alkoxy group having 1~30 carbon atoms, substituted or unsubstituted aryl/aryloxy group having 6~40 carbon atoms, substituted or unsubstituted aralkyl group having 7~40 carbon atoms.

7. The light-emitting device of claim 6,
wherein in the general formula (I), the remaining groups in the groups $Ar_1 \sim Ar_3$ except those selected from the general formula (II) or the general formula (III) are selected from a general formula (IV) or a general formula (V),
wherein the general formula (IV) is:

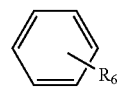
(IV)

any one of the remaining five carbon atoms of the benzene ring in the general formula (IV) except one connected to the branched chain $R_6$ is connected to the N atom in the general formula (I), and
wherein the general formula (V) is:

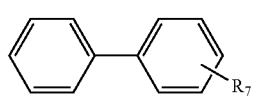
(V)

one carbon atom in the general formula (V) is connected to the N atom in the general formula (I), and the one carbon atom in the general formula (V) refers to any one of the remaining nine carbon atoms of the two benzene rings in the general formula (V) except those connected to the branched chain $R_7$ and connecting the two benzene rings to each other,
wherein each of the branched chains $R_6 \sim R_7$ is selected from any one of: substituted or unsubstituted alkyl/alkoxy group having 1~30 carbon atoms, substituted or unsubstituted aryl/aryloxy group having 6~40 carbon atoms, substituted or unsubstituted aralkyl group having 7~40 carbon atoms.

8. The light-emitting device of claim 1, wherein an average surface roughness of the hole transport layer is less than 5 nm.

9. The light-emitting device of claim 1, further comprising an electron transport layer,
wherein a material of the electron transport layer comprises metal oxide, and the metal oxide comprises at least two metals.

10. The light-emitting device of claim 9, wherein the at least two metals comprise Zn and at least one selected from Mg, Al, Ti, Zr, and Li, and a value of a molar ratio of the Zn to the metal oxide is greater than or equal to 0.7.

11. The light-emitting device of claim 9, wherein an electron mobility of the electron transport layer is greater than or equal to $10^{-4}$ cm$^2$/Vs.

12. The light-emitting device of claim 11, wherein $10^{-2} \leq$ a hole mobility of at least one of the first compound and the second compound: the electron mobility of the electron transport layer $\leq 10^2$.

13. The light-emitting device of claim 9, further comprising:
a hole injection layer,
wherein a material of the first compound is polyvinyl carbazole, and a molar ratio of the first compound to the second compound is 2:1.

14. The light-emitting device of claim 13, wherein a material of the hole injection layer is poly(3,4-ethylenedioxythiophene), a material of the electron transport layer is ZnMgO, a material of the light-emitting layer is CdSe quantum dot, a material of the anode is indium tin oxide, and a material of the cathode is aluminum.

15. The light-emitting device of claim 1, wherein the light-emitting layer comprises quantum dots.

16. A display device comprising the light-emitting device of claim 1.

17. A method of manufacturing a light-emitting device, comprising:
forming an anode;
applying a mixed solution in which at least a first compound and a second compound are mixed on the anode to form a hole transport layer;
forming a light-emitting layer on a side of the hole transport layer away from the anode; and
forming a cathode on a side of the light-emitting layer away from the hole transport layer,
wherein an absolute value of an energy level of the highest occupied molecular orbital of the second compound is greater than or equal to 5 eV and less than or equal to 6.5 eV,
wherein a hole mobility of the second compound is greater than or equal to $10^{-4}$ cm$^2$/Vs.

18. The method of claim 17, wherein the applying a mixed solution in which at least a first compound and a second compound are mixed on the anode to form a hole transport layer comprises:
mixing the first compound and the second compound at a molar ratio of 1:1~100:1 to obtain the mixed solution; and
applying the mixed solution on the anode to form the hole transport layer by coating, printing or electrohydrodynamic jet printing.

\* \* \* \* \*